United States Patent
Purohit et al.

(10) Patent No.: US 11,694,010 B2
(45) Date of Patent: Jul. 4, 2023

(54) REFORMATTING SCAN PATTERNS IN PRESENCE OF HOLD TYPE PIPELINES

(71) Applicant: Synopsys, Inc., Mountain View, CA (US)

(72) Inventors: Amit Gopal M. Purohit, Bangalore (IN); Sorin Ioan Popa, Saint Ismier (FR); Denis Martin, Palo Alto, CA (US); Paras Chhabra, Bangalore (IN)

(73) Assignee: Synopsys, Inc., Mountain View, CA (US)

( * ) Notice: Subject to any disclaimer, the term of this patent is extended or adjusted under 35 U.S.C. 154(b) by 49 days.

(21) Appl. No.: 17/518,024

(22) Filed: Nov. 3, 2021

(65) Prior Publication Data

US 2022/0137126 A1    May 5, 2022

Related U.S. Application Data

(60) Provisional application No. 63/109,078, filed on Nov. 3, 2020.

(51) Int. Cl.
*G06F 30/30* (2020.01)
*G06F 30/333* (2020.01)
(Continued)

(52) U.S. Cl.
CPC ....... *G06F 30/333* (2020.01); *G01R 31/3177* (2013.01); *G01R 31/31704* (2013.01); *G01R 31/31813* (2013.01); *G01R 31/31908* (2013.01); *G01R 31/318371* (2013.01); *G01R 31/318583* (2013.01)

(58) Field of Classification Search
CPC ............ G06F 30/333; G01R 31/31704; G01R 31/3177; G01R 31/31813; G01R 31/318371; G01R 31/31908; G01R 31/318583; G01R 31/318563; G01R 31/318547

See application file for complete search history.

(56) References Cited

U.S. PATENT DOCUMENTS 6,073,265 A    6/2000  Komoda
7,823,034 B2 * 10/2010  Wohl ............. G01R 31/318547
                                                    716/136

(Continued)

FOREIGN PATENT DOCUMENTS

WO    WO 2016/068573 A1    5/2016

OTHER PUBLICATIONS

International Search Report and Written Opinion from International Application No. PCT/US2021/057866 dated Feb. 22, 2022—10 pages.

*Primary Examiner* — Jack Chiang
*Assistant Examiner* — Brandon Bowers
(74) *Attorney, Agent, or Firm* — Lowenstein Sandler LLP

(57) ABSTRACT

A method includes identifying state holding pipeline stages in a pipeline path of a design for test (DFT) of an integrated circuit design, splitting each pattern of a plurality of patterns into a first part and a second part, reformatting the plurality of patterns to generate another plurality of patterns such that the first part and the second part of each pattern of the plurality patterns are included in different patterns of the another plurality of patterns. The length of the first part is a function of a number of the identified pipeline stages.

20 Claims, 16 Drawing Sheets

(51) Int. Cl.
  *G01R 31/317*   (2006.01)
  *G01R 31/3177*  (2006.01)
  *G01R 31/3181*  (2006.01)
  *G01R 31/319*   (2006.01)
  *G01R 31/3183*  (2006.01)
  *G01R 31/3185*   (2006.01)

(56) References Cited

U.S. PATENT DOCUMENTS

| | | | |
|---|---|---|---|
| 8,230,282 B2* | 7/2012 | Touba | G01R 31/318547 |
| | | | 714/732 |
| 10,473,721 B1* | 11/2019 | Cote | G01R 31/31725 |
| 2006/0064614 A1 | 3/2006 | Abdel-hafez et al. | |
| 2014/0143623 A1* | 5/2014 | Touba | G01R 31/318547 |
| | | | 714/728 |
| 2018/0156869 A1 | 6/2018 | Wohl et al. | |

* cited by examiner

| Pattern 0 | A0 | A1 | A2 | A3 | A4 | A5 | A6 | A7 | A8 | A9 |
|---|---|---|---|---|---|---|---|---|---|---|
| Pattern 1 | B0 | B1 | B2 | B3 | B4 | B5 | B6 | B7 | B8 | B9 |
| Pattern 2 | C0 | C1 | C2 | C3 | C4 | C5 | C6 | C7 | C8 | C9 |

| 302 | | | | | | | | | | | | | | |
|---|---|---|---|---|---|---|---|---|---|---|---|---|---|---|
| Pattern 0 | H0 | H1 | H2 | A0 | A1 | A2 | A3 | A4 | A5 | A6 | A7 | A8 | A9 |
| Pattern 1 | H3 | H4 | H5 | B0 | B1 | B2 | B3 | B4 | B5 | B6 | B7 | B8 | B9 |
| Pattern 2 | H6 | H7 | H8 | C0 | C1 | C2 | C3 | C4 | C5 | C6 | C7 | C8 | C9 |

FIG. 3B

| | A0 | A1 | A2 | A3 | A4 | A5 | A6 | A7 | A8 | A9 |
|---|---|---|---|---|---|---|---|---|---|---|
| Pattern 0 | | | | | | | | | | |
| Pattern 1 | B0 | B1 | B2 | B3 | B4 | B5 | B6 | B7 | B8 | B9 |
| Pattern 2 | C0 | C1 | C2 | C3 | C4 | C5 | C6 | C7 | C8 | C9 |

|           |   |    |    |    |    |    |    |    |    |    |    |    |
|-----------|---|----|----|----|----|----|----|----|----|----|----|----|
| Pattern 0 | N | N  | N  | N  | N  | N  | N  | N  | A0 | A1 | A2 |
| Pattern 1 | A3| A4 | A5 | A6 | A7 | A8 | A9 | B0 | B1 | B2 |
| Pattern 2 | B3| B4 | B5 | B6 | B7 | B8 | B9 | C0 | C1 | C2 |
| Pattern 3 | C3| C4 | C5 | C6 | C7 | C8 | C9 | D0 | D1 | D2 |

| 310 | | | | | | | | | | | |
|---|---|---|---|---|---|---|---|---|---|---|---|
| Pattern 0 | N | N | N | N | N | N | A0 | A1 | A2 | | |
| Pattern 1 | A3 | A4 | A5 | A6 | A7 | A8 | A9 | B0 | B1 | B2 | |
| Pattern 2 | B3 | B4 | B5 | B6 | B7 | B8 | B9 | C0 | C1 | C2 | |
| Pattern 3 | C3 | C4 | C5 | C6 | C7 | C8 | C9 | D0 | D1 | D2 | |

Capture (under Pattern 1), Capture (under Pattern 2), Capture (under Pattern 3)

FIG. 3E

| Head | Head | Head | SC | SC | SC | SC | SC | SC | SC | SC | SC | SC |
|---|---|---|---|---|---|---|---|---|---|---|---|---|
| 1 | 2 | 3 | 1 | 2 | 3 | 4 | 5 | 6 | 7 | 8 | 9 | 10 |
| A2 | A1 | A0 | A9 | A8 | A7 | A6 | A5 | A4 | A3 | A2 | A1 | A0 |
| B2 | B1 | B0 | B9 | B8 | B7 | B6 | B5 | B4 | B3 | B2 | B1 | B0 |
| | | | N | N | N | N | N | N | N | | | |
| C2 | C1 | C0 | B9 | B8 | B7 | B6 | B5 | B4 | B3 | B2 | B1 | B0 |

312

Capture

Capture

FIG. 3F

REFORMATTING SCAN PATTERNS IN PRESENCE OF HOLD TYPE PIPELINES

CROSS-REFERENCE TO RELATED APPLICATIONS

The present application claims the benefit under 35 U.S.C. § 119(e) of U.S. Provisional Patent Application No. 63/109,078 filed on Nov. 3, 2020, which is incorporated herein by reference in its entirety for all purposes.

TECHNICAL FIELD

The present disclosure relates to scan-based integrated circuit (IC). In particular, the present disclosure relates to reformatting scan patterns in presence of hold type pipelines.

BACKGROUND

Design for test (DFT) may use a scan based design for testing integrated circuits as the scan-based technique is fast and gives more coverage. Scan chain-based design is the preferred mechanism for achieving maximum possible coverage by converting all design flops into scan flops and then by stitching those scan flops together to create scan chains. The scan chain-based design gives better coverage that in turn improves a product yield. In addition, a scan chain based diagnosis identifies root cause of logic failures in circuits easily. During testing of a chip, scan chains are tested first. Then, a functional circuit is tested for any fault in the circuit using scan chains shift and capture. As designs grow larger and a number of scan flops increases in a circuit design, each scan chain length also increases. Design test time is directly proportional to a scan chain length. Thus, scan test time increases as design grows.

Hierarchical test methodology is used to divide and conquer the increasingly large and complex designs where each design is divided into multiple cores. The cores are integrated at a top level. DFT insertion and automatic test-pattern generation (ATPG) are performed at a core level.

SUMMARY

In one aspect, a method includes identifying pipeline stages in a pipeline path of a design for test (DFT) of an integrated circuit design, splitting each pattern of a plurality of patterns into a first part and a second part, reformatting the plurality of patterns to generate another plurality of patterns such that the first part and the second part of each pattern of the plurality patterns are included in different patterns of the another plurality of patterns. The length of the first part is a function of a number of the identified pipeline stages.

In one aspect, a system includes a memory storing instructions and a processor coupled with the memory and to execute the instructions. The instructions when executed cause the processor to identify pipeline stages in a pipeline path of a DFT of an integrated circuit design, split each pattern of a plurality of patterns into a first part and a second part, reformat the plurality of patterns to generate another plurality of patterns such that the first part and the second part of each pattern of the plurality patterns are included in different patterns in the another plurality of patterns. A length of the first part is a function of a number of the identified pipeline stages.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

FIGS. 3A-3F illustrate exemplary patterns, in accordance with an embodiments of the present disclosure.

DETAILED DESCRIPTION

Figure 1:
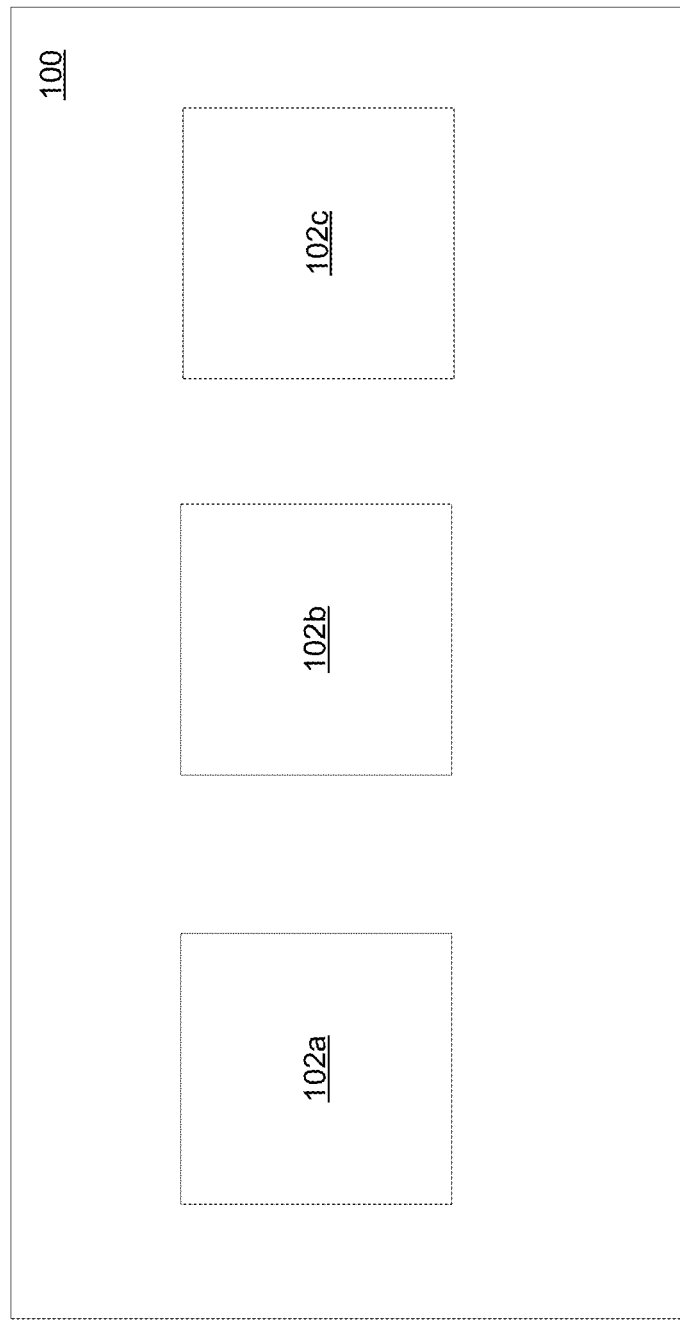
FIG. 1 is a block diagram of a layout of a system-on-a-chip (SOC), in accordance with an embodiment of the present disclosure.

Aspects of the present disclosure relate to reformatting scan patterns in presence of hold type pipelines.

Scan test time in a scan based design for test (DFT) is directly proportional to a shift length of scan patterns (referred to herein as patterns). Scan patterns are applied to a scan-based design through the scan chains. An output response to a scan pattern is compared to an expected fault-free response (i.e., a golden value). The scan test time determines an overall test-cost for a chip. In order to meet timing requirements for cores (blocks) of a design, there can be certain stages of head and tail pipeline stages in between a top level port and core pins. These pipelines stages increase the scan test time as these are included in a scan shift path. All head pipeline stages are filled first in order to fill scan chain with expected data in every pattern. Then, data is shifted to scan flops. Thus, unnecessary clock cycles are used to fill the head pipeline stages. If the head pipeline stages are longer than the scan chain, filling the head pipeline stages takes more cycles than the actual scan flops loading. Similar problems are faced for tail pipelines for unloading. The actual scan chain unloading can start after the tail pipelines have been unloaded. Pipeline stages are usually configured to hold state during a capture cycle so the pipeline stages do not affect coverage but affect the scan test time.

Hence, increasing pipeline stages to meet timing affects test-cost adversely without increasing test coverage. In case of pipeline stages, the total test time increases in exact ratio of a number of pipeline stages to a total scan chain length. As the number of pipeline stages increases, the test time increases. In some examples, the scan test time can be doubled. In addition, a big bottleneck is imposed with respect to the test time when the number of pipeline stages is more than a scan chain length. Thus, it is desired to limit the effect of pipeline stages on test-time while using the state holding nature of the pipeline stages.

Embodiments disclosed herein solve the problem of the increased scan time due to the head pipeline stages. The approaches described herein limit the effect of the state holding pipeline stages (referred to herein as pipeline stages) on the scan test time by using the state holding nature of pipeline stages during capture. This makes the scan test time almost independent of the number of pipeline stages. In addition, the approaches described herein make scan enable synchronization easier when multiple cores with same shift lengths but different pipeline stages outside cores share a scan enable signal.

In some embodiments, once core patterns are generated, existing core patterns can be reformatted for top-level pipeline stages by doing bottom-up DFT insertion and pattern porting. This makes hierarchical DFT insertion and pattern porting seamless. Core level pattern generation takes care of pipeline stages that are within the core. All top hierarchies can reformat the core patterns by adjusting for the additional pipeline stages added outside of the core at each hierarchy.

In some embodiments, reformatted patterns (also referred to herein as pipeline independent patterns (PIP)) are generated from a set of patterns by splitting and reformatting a scan pattern load into two separate patterns such that the scan pattern shift length is not increased. The reformatted patterns (i.e., PIPs) do not change in length even when pipelines are present. The reformatted patterns may utilize the pipeline stages state holding nature during capture. The scan patterns are reformatted such as that each loading of a pattern of the reformatted patterns set makes head pipeline stages ready for a consecutive (i.e., next) pattern. This is done by reformatting patterns such that a first shift only loads head pipelines for a first pattern or pattern 0.

In some embodiments, capture is delayed by at least one pattern as scan cells are not loaded completely after the first pattern or pattern 0. The first pattern may represent a padding pattern. Every consecutive pattern (i.e., after pattern 0) shift in bits such that values already holding in head pipeline stages in addition to shifted bits load all scan cells as it would have loaded before the patterns are reformatted while making head pipeline ready for the next pattern. Thus, the pipelines are used as cache for the next load cycle. The number of padding patterns (e.g., pattern 0) can be a function of the number head pipeline stages and the scan shift length. For example, two or more padding patterns may be used when the number of head pipeline stages is greater than the scan shift length. The one or more dummy patterns may be added to the start of the reformatted patterns set and the dummy patterns are loaded first.

In some embodiments, a similar approach is adopted for tail pipelines as well. As tail pipelines are also state holding in nature. A value to be compared is kept equal to a shift length not including pipeline stages. Using the reformatting described herein, the scan shift length is not increased even after adding a number of head and tail pipeline stages at different hierarchies. The reformatted patterns are completely un-foldable as a bottom-up DFT insertion is used and pattern porting and pipeline stages are added at each hierarchy.

Advantages of the present disclosure include, but are not limited to, preserving a scan time for DFT regardless of the number of pipeline stages added. The shift length that directly affects test-time does not increase due to the addition of the pipeline stages. Hierarchical flows where patterns are generated at a bottom level (core level) and ported in a bottom-up fashion while adding pipeline stages at each hierarchy becomes easier. Patterns are not regenerated and may be reformatted depending on the available pipeline stages at each hierarchy. Further, the generation of patterns at core level is not dependent on the number of pipeline stages that are used at the top level. Users running automatic test-pattern generation (ATPG) at the core level can be completely agnostic to the pipelines at the top level since patterns are "pipeline independent." Further, multiple cores with the same shift length but with different pipeline stages do not impose issue in scan enable timing. For example, a scan enable signal is independent of the number of pipeline stages (i.e., no clock cycles are used to fill the head pipeline stages) and capture timing (scan enable signal low) is independent of the number of pipeline stages. Thus, the same scan enable signal may be used for the multiple cores having the same shift length.

FIG. 1 is a block diagram of a layout of a system-on-a-chip (SOC), in accordance with an embodiment of the present disclosure. SOC 100 may include a first core 102a, a second core 102b, and a third core 102c. In some embodiments, patterns generated at a core level are used at a chip level (top level). Internal cores or blocks are core-wrapped and isolated so that the patterns are not corrupted by top level connections and interconnects. In some aspects, ATPG may be run on each core individually at the core level. For example, ATPG may run for each of first core 102a, second core 102b, and third core 102c individually. Then, the generated patterns may be ported to the chip level. The patterns are reformatted as described herein before transfer to the chip level. Thus, the patterns from all the cores are transformed to their hierarchical equivalent. In some embodiments, the core may be compressed cores or uncompressed cores. Further, the SOC may have a dedicated scan input or a shared scan input.

Figure 2A:
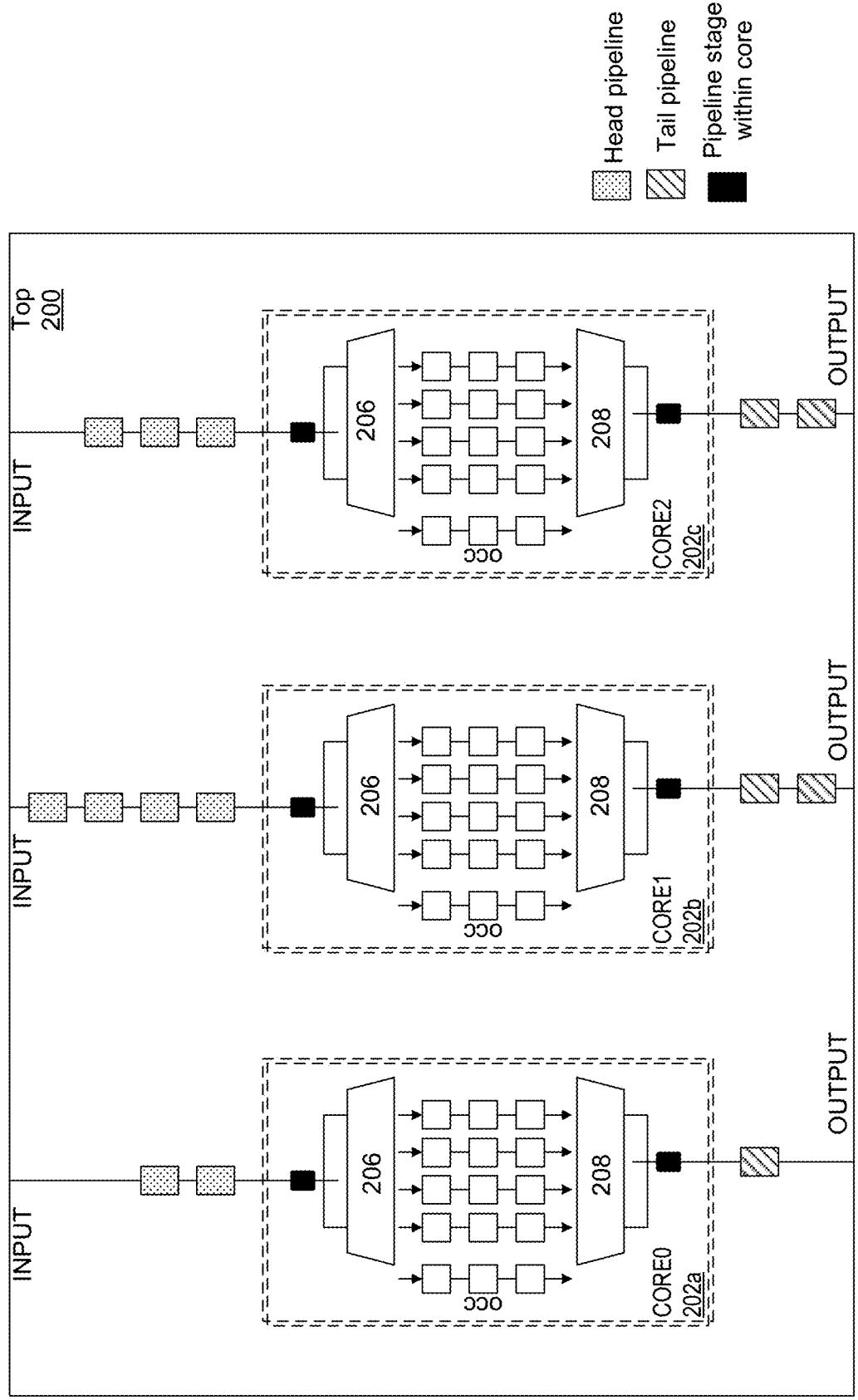
FIGS. 2A-2D are block diagrams of exemplary SOC layouts, in accordance with an embodiment of the present disclosure.

FIG. 2A is a block diagram of a layout of a SOC for a dedicated scan input with state holding pipelines with compressed cores in accordance with an embodiment of the present disclosure. SOC 200 includes three identical cores 202a, 202b, and 202c. Each core includes a compressor 206 and a decompressor 208.

The generated patterns are ported to the top level via tail pipelines and head pipelines. The generated patterns at the core level are reformatted as further described below. The test time remains the same even when the pipeline length is not identical for each core. For example, one tail pipeline stage is associated with core 202a but two holding stages are associated with core 202b and core 202c. SOC 200 includes scan inputs and scan outputs that are connected to the compressor 206 and decompressor 208 of each core. Each core of cores 202a, 202b, 202c includes a scan chain dedicated to the on-chip clocking (denoted OCC in FIG. 2A). Each core shows four scan chains. In some aspects, each scan chain has a scan chain length of three.

Figure 2B:
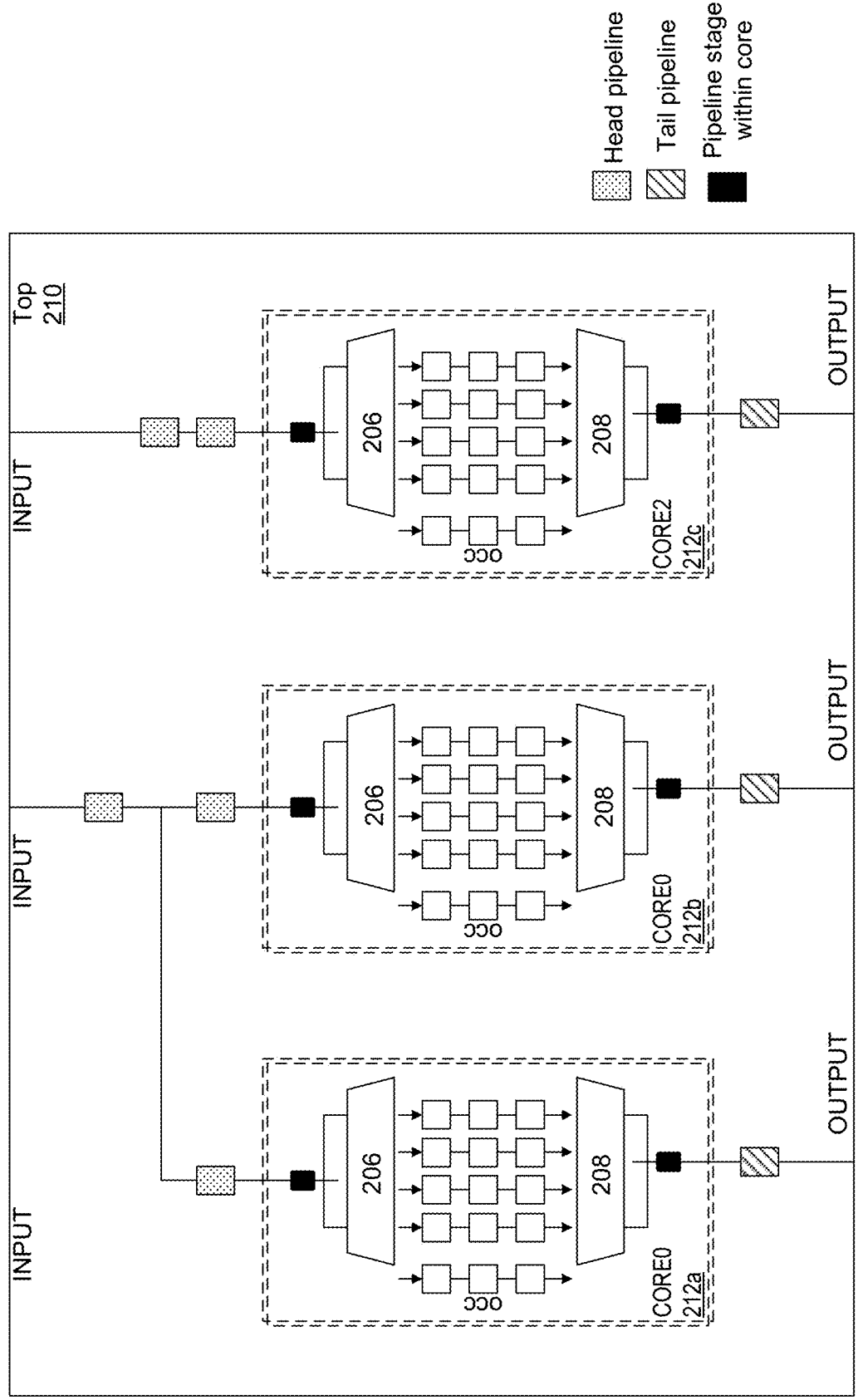

FIG. 2B is a block diagram of a layout of a SOC 210 for a shared scan input with state holding pipelines with compressed cores. SOC 210 includes three identical compressed cores 212a, 212b, and 212c. Core 212a and core 212b have a shared input. Each core of cores 212a, 212b, 212c includes a scan chain dedicated to the on-chip clocking (denoted OCC in FIG. 2B). Each core shows four scan chains. In some aspects, each scan chain has a scan chain length of three.

Figure 2C:
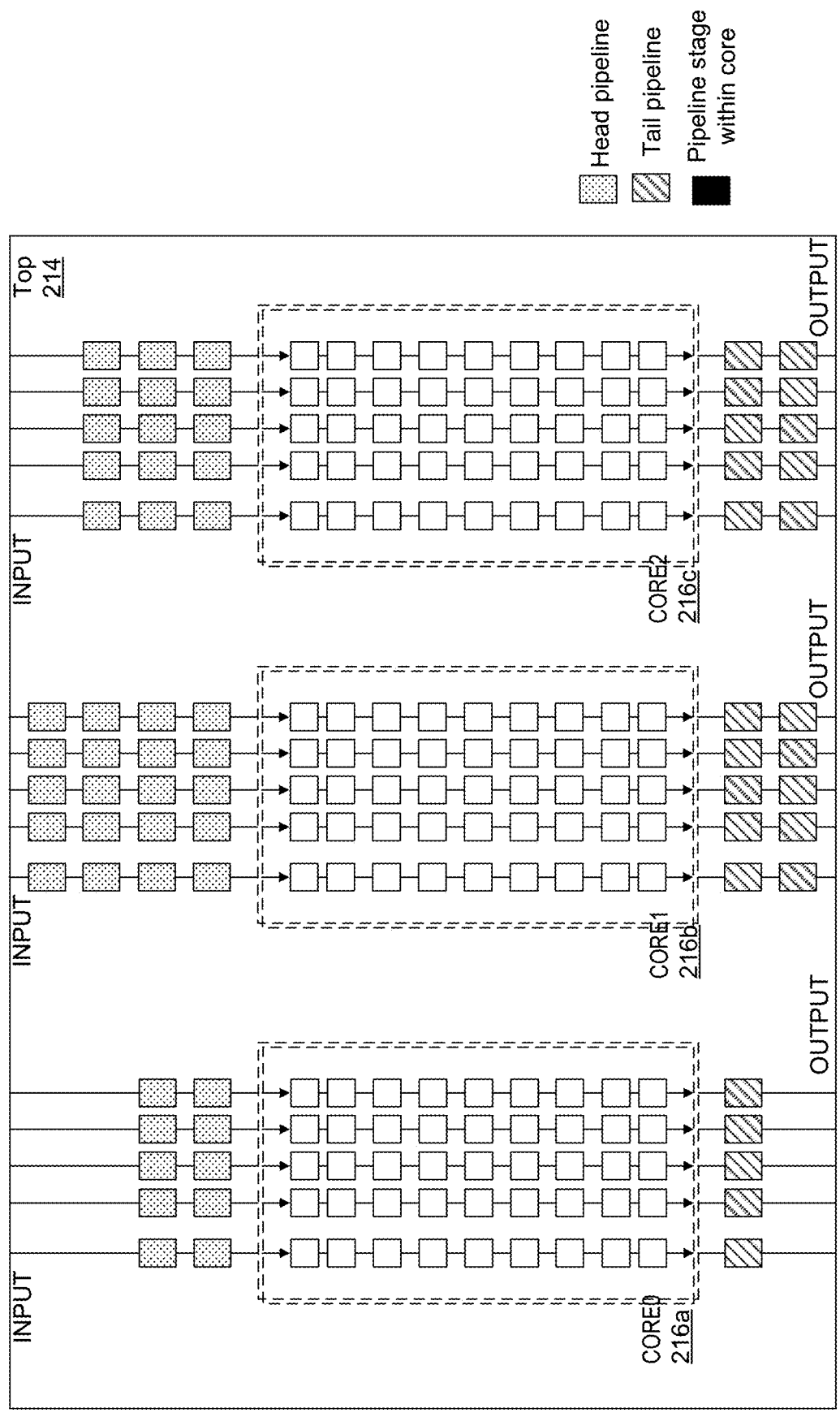

FIG. 2C is a block diagram of a layout of a SOC 214 for a dedicated scan input with state holding pipelines with uncompressed cores, in accordance with an embodiment of the present disclosure. SOC 214 includes core 216a, core 216b, and core 216c. Cores 216a, 216b, and 216c are uncompressed. SOC 214 has a dedicated scan input. Each core shows five scan chains. In some aspects, each scan chain has a scan chain length of nine.

Figure 2D:
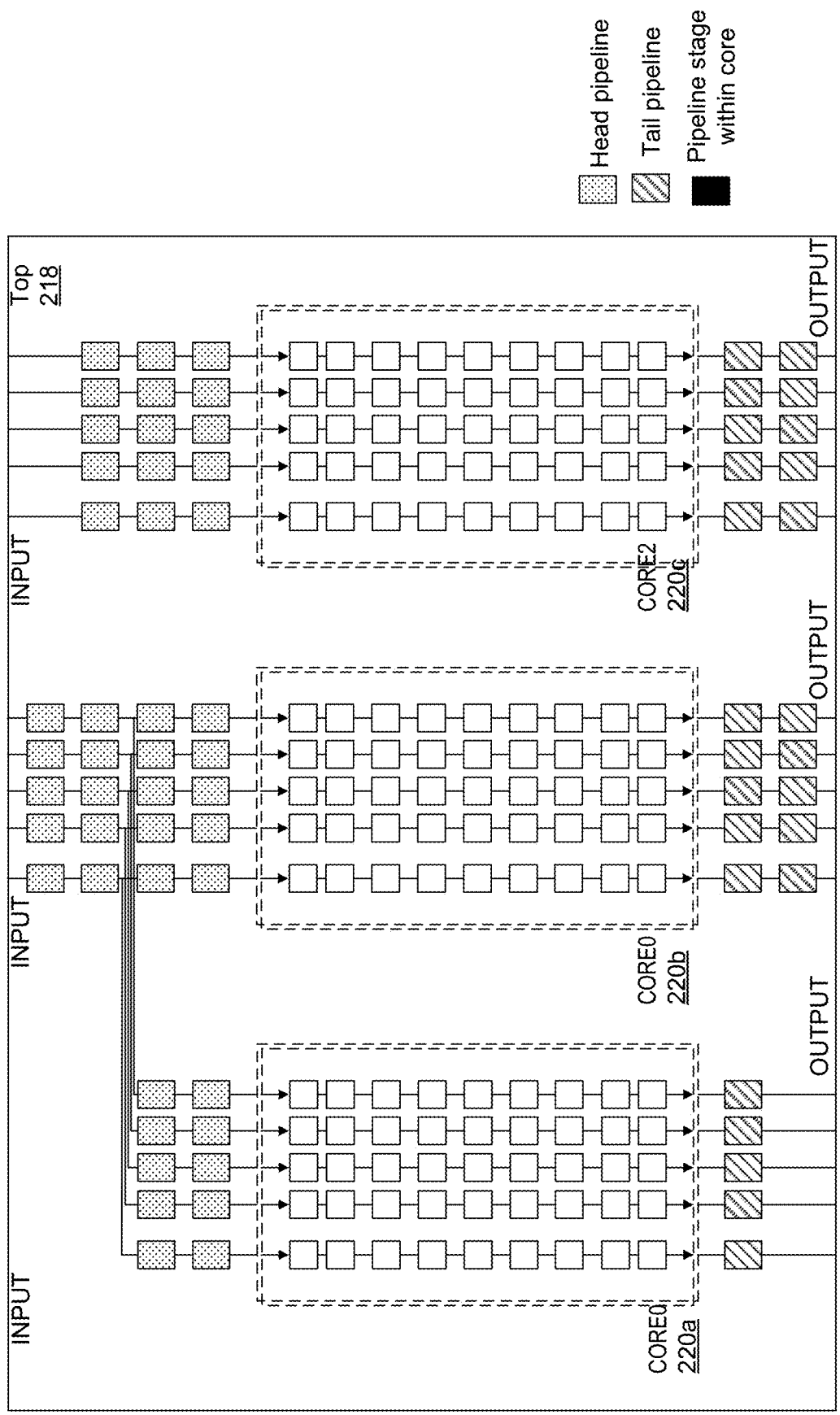

FIG. 2D is a block diagram of a layout of a SOC 218 for a shared scan input with state holding pipelines with uncompressed cores, in accordance with an embodiment of the present disclosure. SOC 218 includes core 220*a*, core 220*b*, and core 220*c*. Cores 220*a*, 220*b*, and 220*c* are uncompressed. SOC 218 has a shared scan input. Each core shows five scan chains. In some aspects, each scan chain has a scan chain length of nine.

In some embodiments, a core may have one scan in, one scan out, a core shift length equals to 10, and three head pipeline stages in addition to the core shift length. An exemplary three patterns load is shown in table 300 of FIG. 3A.

In one example, the core is uncompressed with a chain length of 10. So after "Pattern 0" is loaded, scan cells have the values as shown in table 1. Similarly, after patterns 1 and 2 are loaded, scan cells have exactly the same bits. Here, captures can happen after each load-unload.

Now, if the core has 3 head pipeline stages in addition to the scan cells as part of the scan chain, each shift is increased by the number of head pipeline stages which is 3 in this example. This increases the overall shift length by the number of head pipes times the number of total scan patterns.

Table 302 of FIG. 3B shows the patterns in presence of head pipelines (e.g., three head pipeline stages).

In one example, the header bits ("H") are loaded in the head pipeline stages while scan cells are loaded with same values as before. By using the state holding nature of pipeline stages, the patterns can be reformatted such that before every capture, all scan cells have the exact same value as those might have without PIP (i.e., before reformatting) with shorter shift length as compared to the non reformatted patterns.

In some embodiments, each pattern of a pattern set load is split into two parts. Bits of a first part is made equal to the number of head pipeline stages. Bits of a second part are equal to the pattern shift length minus the number of the head pipeline stages. Table 306 of FIG. 3C shows the splitting of load patterns for reformatting.

Pattern 0 in the reformatted pattern set (i.e., PIP format) is not a complete pattern and is used only for loading the head pipeline stages (i.e., padding pattern). There is no capture after loading pattern 0. The patterns can be reformatted with the head pipeline stages as 3 as shown in table 308 of FIG. 3D. The shift length is equal to 10.

Here, the scan shift length remains equal to 10 and is not increased because of the head pipeline stages and the number of captures is the same as when using non PIP (i.e., without reformatting the patterns). As discussed previously herein, there is no capture after loading pattern 0. Pattern 0 does not load all scan cells, so capture call (or capture cycle) is skipped. Thus, the first capture cycle is performed after loading the first real pattern (i.e., pattern 1). Table 310 of FIG. 3E shows the full pattern.

State of scan cells after shifting the reformatted patterns (shown in table 310) in each stage are shown in table 312 of FIG. 3F.

In some embodiments, the total shift length does not change due to addition of the pipeline stages with overhead of at least one shift while making sure that at the time of capture, all scan cells are loaded correctly. The overhead can be more than one pattern in cases when the number of head pipeline stages are more than the scan chain length. The pipelines act as a buffer zone, and the scan cells are loaded with the correct values without increasing the shift cycle.

In some embodiments, the reformatted patterns use state holding during capture nature of pipeline flops. The patterns are formatted such that each shift pattern load over-looks the next shift and prepares head pipeline flops for it. This causes load-unload patterns to be folded where after each scan pattern shift load. Thus, scan cells are loaded exactly same as it would have in absence of the reformatting while at the same time loads the head pipeline flops of the next load.

Figure 4:
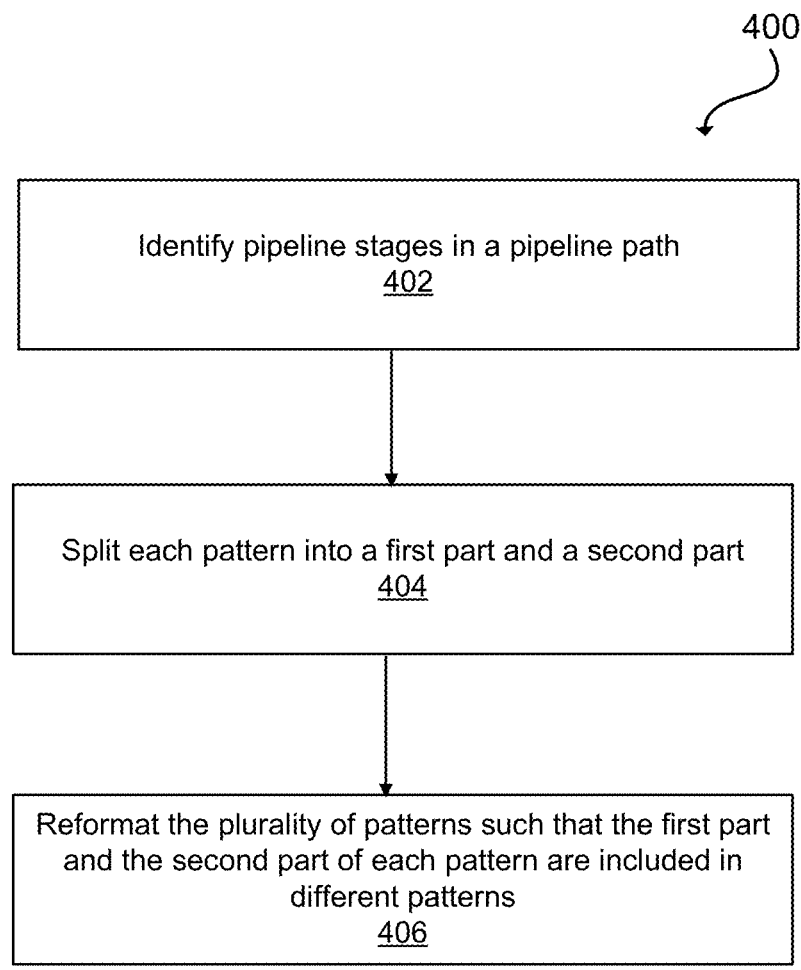
FIG. 4 illustrates a flowchart for reformatting patterns, in accordance with an embodiment of the present disclosure.

FIG. 4 illustrates a flowchart 400 for reformatting patterns for DFT, in accordance with an embodiment of the present disclosure.

In 402, pipeline stages in a pipeline path of a DFT of an IC design are identified. For example, a set of patterns associated with the IC design may be acquired and the number of pipeline stages in the SOC identified. The pipelines may be head pipelines or tail pipelines.

In 404, each pattern of a plurality of patterns of a pattern set is split into a first part and a second part. A length of the first part is a function of a number of the identified pipeline stages. For example, if the number of identified pipeline stages is three, then the length of the first part may be equal to three bits.

In 406, the plurality of patterns are reformatted to generate another set of patterns (a plurality of reformatted patterns) such that the first part and the second part of each pattern of the plurality patterns are included in different patterns of a reformatted patterns set (i.e., another plurality of patterns). In some embodiments, the reformatting includes moving the first part associated with a pattern of the plurality of patterns to a preceding pattern in the pattern set. The second part of the preceding pattern is shifted to a beginning portion of the preceding pattern in the reformatted pattern set. For the example, if the second part has a length of seven, the second part may represent the first seventh bits of the reformatted pattern. The first is moved to an end portion of the preceding pattern (i.e., the last three bits of the preceding pattern) in the reformatted patterns set.

In some aspects, a dummy pattern is added at a start of the reformatted patterns set. The dummy pattern includes null values. The dummy pattern provides load values for a first real pattern. In some embodiments, loading the reformatted patterns set start with the dummy pattern. After the dummy pattern is loaded, the first real pattern is loaded. In some embodiments, a first capture cycle is performed after loading the first real pattern. In some embodiments, the first capture cycle is performed after all the dummy patterns are loaded.

It should be understood that some of the above steps of the flow diagram of FIG. 4 can be executed or performed in an order or sequence other than the order shown and described in the figure. Further, some of the above steps may be performed well in advance of other steps, or may be executed or performed substantially simultaneously or in parallel.

Table 1 shows that for the same scan pattern shift length, increasing head pipeline stages increases non PIP pattern serial simulation time linearly while reformatting the patterns makes the simulation time almost independent of number of pipeline stages.

TABLE 1

Simulation results

| Shift length per pattern | Head pipe stages | Simulation time without reformatting (ns) | Serial simulation time with reformatting (ns) |
|---|---|---|---|
| 193 | 10 | 4511800.00 | 4464800.00 |
| 193 | 50 | 5572000.00 | 4464800.00 |
| 193 | 100 | 6677200.00 | 4464800.00 |
| 193 | 150 | 7624600.00 | 4464800.00 |
| 193 | 190 | 8874600.00 | 4464800.00 |
| 193 | 200 | 8852800.00 | 4484200.00 |
| 193 | 450 | 13751400.00 | 4503600.00 |

Figure 5:
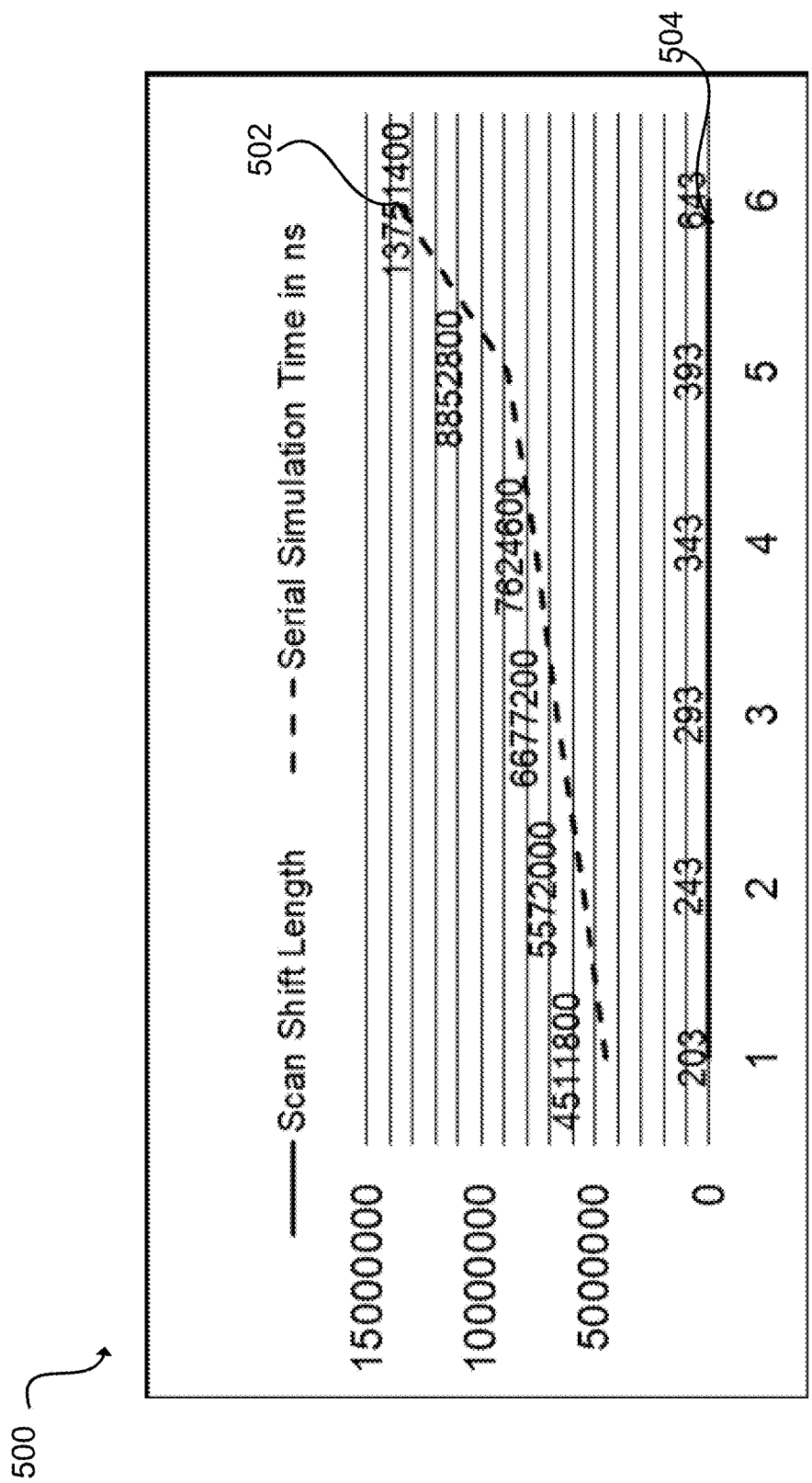
FIG. 5 illustrates a non-reformatted serial pattern simulation time versus a number of head pipelines, in accordance with an embodiment of the present disclosure.

FIG. 5 illustrates a non reformatted serial pattern simulation time versus a number of pipeline stages, in accordance with an embodiment of the present disclosure. Trace 504 shows the scan shift length and trace 502 shows the serial simulation time in ns for non-reformatted patterns. The simulation time increases when the shift length increases.

Figure 6:
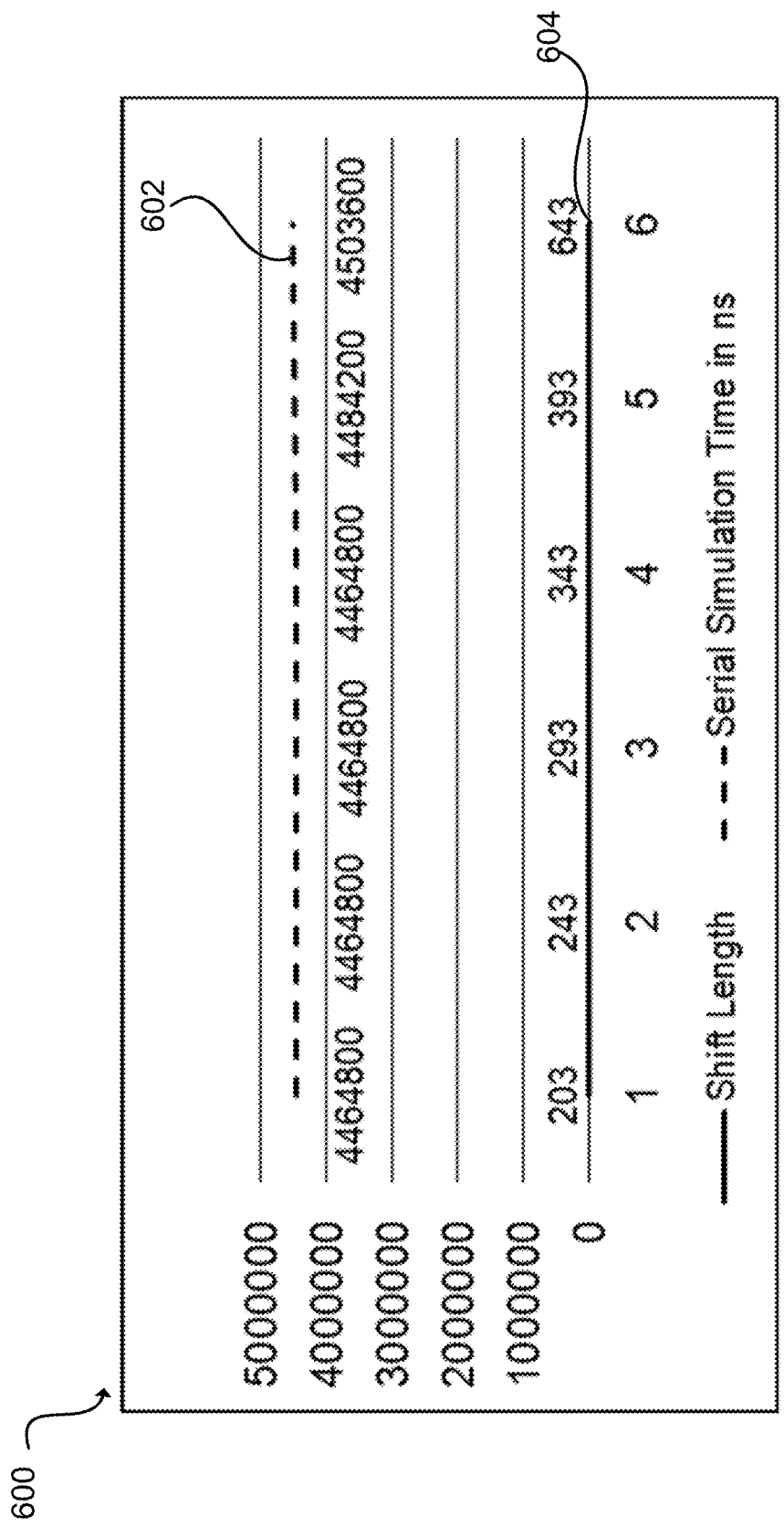
FIG. 6 illustrates a reformatted serial pattern simulation time a number of head pipelines, in accordance with an embodiment of the present disclosure.

FIG. 6 illustrates a reformatted serial pattern simulation time versus a number of pipeline stages, in accordance with an embodiment of the present disclosure. Trace 604 shows the scan shift length and trace 602 shows the serial simulation time in ns for reformatted patterns (i.e., PIP patterns). The simulation time does not increase when the shift length increases.

Figure 7:
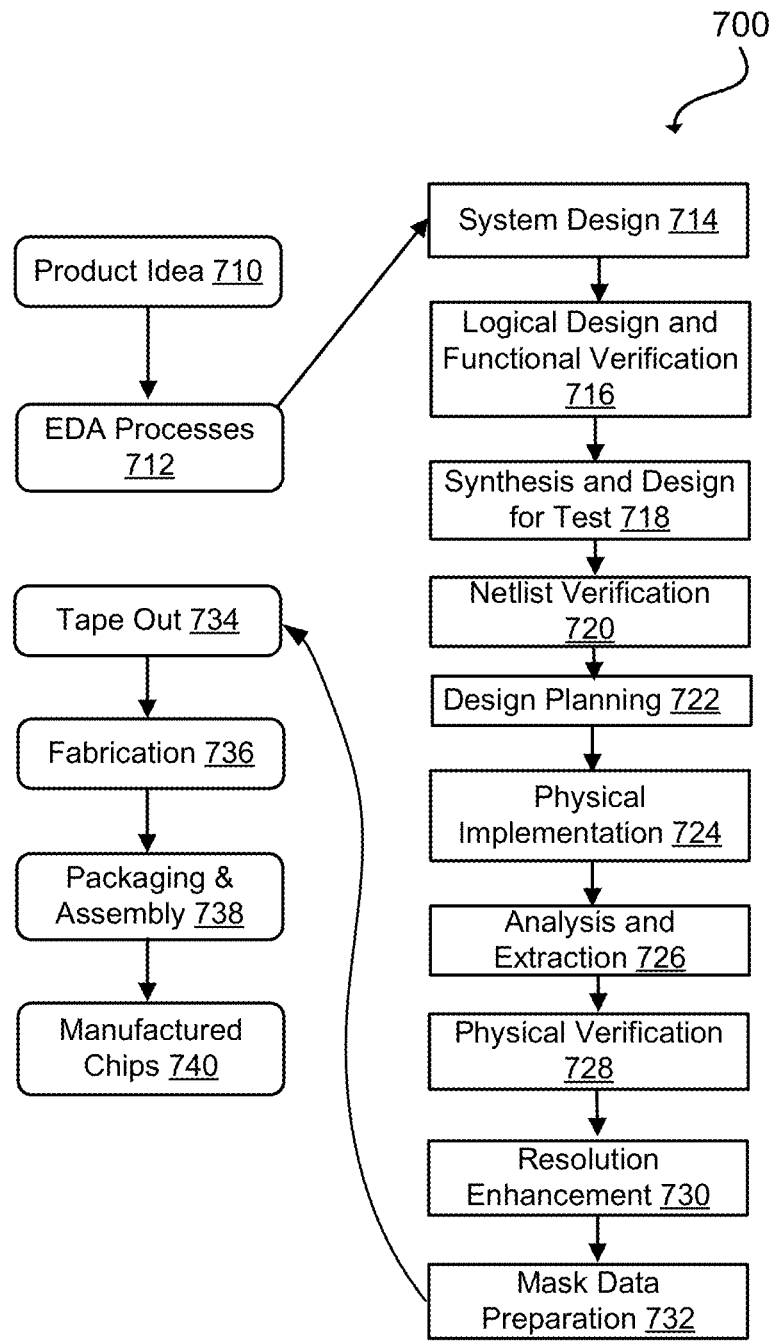
FIG. 7 depicts a flowchart of various processes used during the design and manufacture of an integrated circuit in accordance with some embodiments of the present disclosure.

FIG. 7 illustrates an example set of processes 700 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 710 with information supplied by a designer, information which is transformed to create an article of manufacture that uses a set of EDA processes 712. When the design is finalized, the design is taped-out 734, which is when artwork (e.g., geometric patterns) for the integrated circuit is sent to a fabrication facility to manufacture the mask set, which is then used to manufacture the integrated circuit. After tape-out, a semiconductor die is fabricated 736 and packaging and assembly processes 738 are performed to produce the finished integrated circuit 740.

Specifications for a circuit or electronic structure may range from low-level transistor material layouts to high-level description languages. A high-level of abstraction may be used to design circuits and systems, using a hardware description language ('HDL') such as VHDL, Verilog, SystemVerilog, SystemC, MyHDL or OpenVera. The HDL description can be transformed to a logic-level register transfer level ('RTL') description, a gate-level description, a layout-level description, or a mask-level description. Each lower abstraction level that is a less abstract description adds more useful detail into the design description, for example, more details for the modules that include the description. The lower levels of abstraction that are less abstract descriptions can be generated by a computer, derived from a design library, or created by another design automation process. An example of a specification language at a lower level of abstraction language for specifying more detailed descriptions is SPICE, which is used for detailed descriptions of circuits with many analog components. Descriptions at each level of abstraction are enabled for use by the corresponding tools of that layer (e.g., a formal verification tool). A design process may use a sequence depicted in FIG. 7. The processes described can be enabled by EDA products (or tools).

During system design 714, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 716, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 718, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 720, the netlist is checked for compliance with timing constraints and for correspondence with the HDL code. During design planning 722, an overall floor plan for the integrated circuit is constructed and analyzed for timing and top-level routing.

During layout or physical implementation 724, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 726, the circuit function is verified at the layout level, which permits refinement of the layout design. During physical verification 728, the layout design is checked to ensure that manufacturing constraints are correct, such as DRC constraints, electrical constraints, lithographic constraints, and that circuitry function matches the HDL design specification. During resolution enhancement 730, the geometry of the layout is transformed to improve how the circuit design is manufactured.

During tape-out, data is created to be used (after lithographic enhancements are applied if appropriate) for production of lithography masks. During mask data preparation 732, the 'tape-out' data is used to produce lithography masks that are used to produce finished integrated circuits.

A storage subsystem of a computer system (such as computer system 800 of FIG. 8) may be used to store the programs and data structures that are used by some or all of the EDA products described herein, and products used for development of cells for the library and for physical and logical design that use the library.

Figure 8:
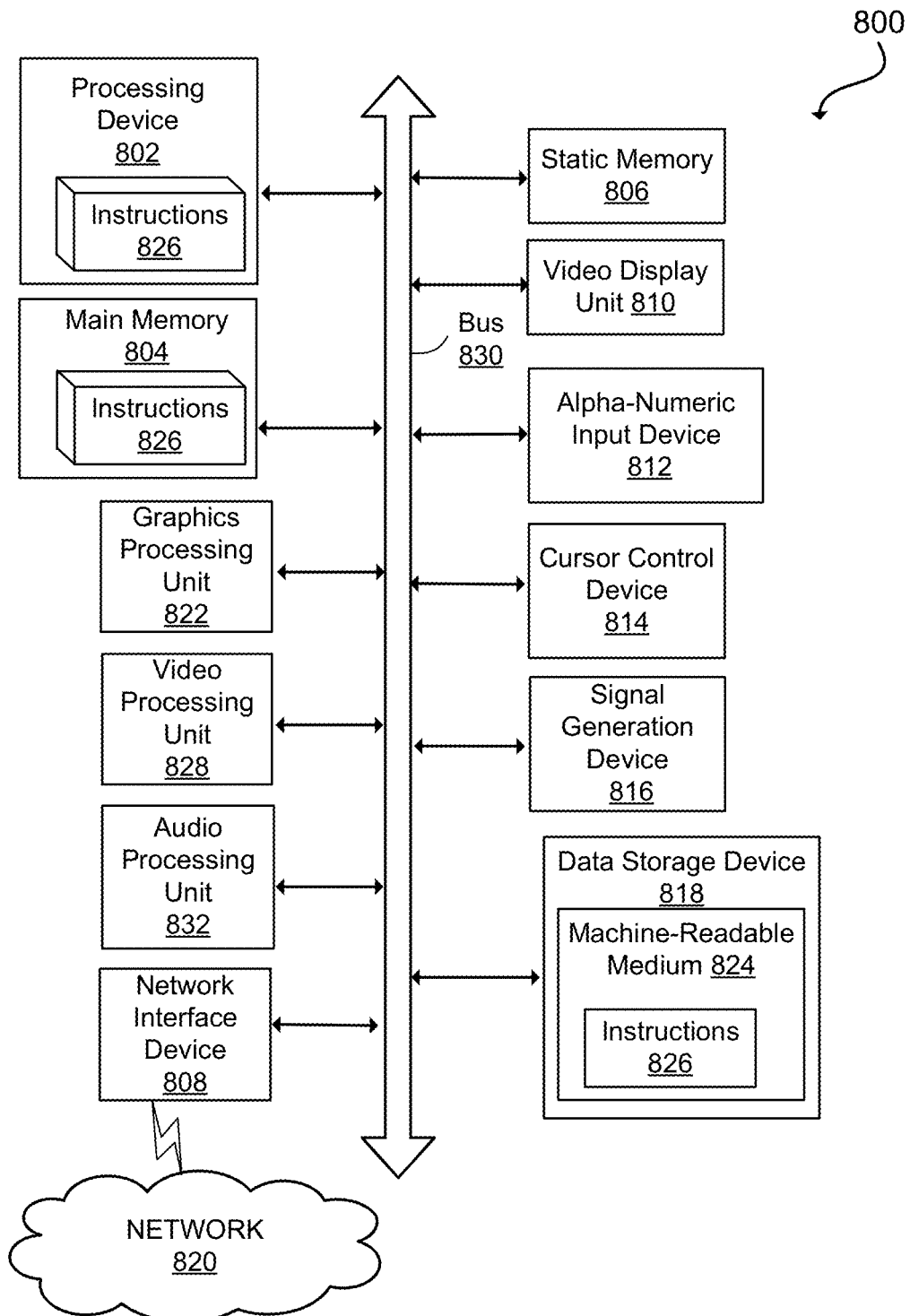
FIG. 8 depicts a diagram of an example computer system in which embodiments of the present disclosure may operate.

FIG. 8 illustrates an example machine of a computer system 800 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 800 includes a processing device 802, a main memory 804 (e.g., read-only memory (ROM), flash memory, dynamic random access memory (DRAM) such as synchronous DRAM (SDRAM), a static memory 806 (e.g., flash memory, static random access memory (SRAM), etc.), and a data storage device 818, which communicate with each other via a bus 830.

Processing device 802 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 802 may also be one or more special-purpose processing devices such as an application specific integrated circuit (ASIC), a field programmable gate array (FPGA), a digital signal processor (DSP), network processor, or the like. The processing device 802 may be configured to execute instructions 826 for performing the operations and steps described herein.

The computer system 800 may further include a network interface device 808 to communicate over the network 820. The computer system 800 also may include a video display unit 810 (e.g., a liquid crystal display (LCD) or a cathode ray tube (CRT)), an alphanumeric input device 812 (e.g., a keyboard), a cursor control device 814 (e.g., a mouse), a graphics processing unit 822, a signal generation device 816 (e.g., a speaker), graphics processing unit 822, video processing unit 828, and audio processing unit 832.

The data storage device 818 may include a machine-readable storage medium 824 (also known as a non-transitory computer-readable medium) on which is stored one or more sets of instructions 826 or software embodying any one or more of the methodologies or functions described herein. The instructions 826 may also reside, completely or at least partially, within the main memory 804 and/or within the processing device 802 during execution thereof by the computer system 800, the main memory 804 and the processing device 802 also constituting machine-readable storage media.

In some implementations, the instructions 826 include instructions to implement functionality corresponding to the present disclosure. While the machine-readable storage medium 824 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 802 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those that physically manipulate physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A method comprising:
identifying pipeline stages in a pipeline path of a design for test (DFT) of an integrated circuit design;
splitting, by a processor, each pattern of a plurality of patterns into a first part and a second part, wherein a length of the first part is a function of a number of the identified pipeline stages; and
reformatting, by the processor, the plurality of patterns to generate another plurality of patterns such that the first part and the second part of each pattern of the plurality patterns are included in different patterns of the another plurality of patterns.

2. The method of claim 1, wherein the reformatting includes:
adding at least one padding pattern at a start of the another plurality of patterns that includes null values, wherein the at least one padding pattern provides load values for a first real pattern and wherein the at least one padding pattern is loaded before other patterns in the another plurality of patterns.

3. The method of claim 2, further comprising:
performing a first capture cycle after loading the first real pattern.

4. The method of claim 2, wherein the at least one padding pattern comprises a quantity of padding patterns based on a quantity of identified pipeline stages and a scan shift length of a core of the DFT.

5. The method of claim 1, wherein reformatting the plurality of patterns further comprises:
moving the first part associated with a pattern of the plurality of patterns to a preceding pattern in the plurality of patterns.

6. The method of claim 5, further comprising:
shifting the second part of the preceding pattern of the plurality of patterns to a beginning portion of the preceding pattern in the another plurality of patterns, and wherein the first part is moved to an end portion of the preceding pattern in the another plurality of patterns.

7. The method of claim 1, further comprising:
selecting the length of the first part equals to the number of identified pipeline stages.

8. A system comprising:
a memory storing instructions; and
a processor, coupled with the memory and to execute the instructions, the instructions when executed cause the processor to:
identify pipeline stages in a pipeline path of a design for test (DFT) of an integrated circuit design,
split each pattern of a plurality of patterns into a first part and a second part, wherein a length of the first part is a function of a number of the identified pipeline stages, and
reformat the plurality of patterns to generate another plurality of patterns such that the first part and the second part of each pattern of the plurality patterns are included in different patterns in the another plurality of patterns.

9. The system of claim 8, wherein the processor is further configured to:
add at least one padding pattern at a start of the another plurality of patterns that includes null values, wherein the at least one dummy pattern provides load values for a first real pattern, wherein the at least one dummy pattern is loaded before other patterns in the another plurality of patterns.

10. The system of claim 9, wherein the processor is further configured to:
perform a first capture cycle after loading the first real pattern.

11. The system of claim 9, wherein the at least one padding pattern comprises a quantity of padding patterns based on a quantity of identified pipeline stages and a scan shift length of a core of the DFT.

12. The system of claim 8, wherein the processor is further configured to:
move the first part associated with a pattern of the plurality of patterns to a preceding pattern in the plurality of patterns.

13. The system of claim 12, wherein the processor is further configured to:
shift the second part of the preceding pattern of the plurality of patterns to a beginning portion of the preceding pattern in the another plurality of patterns, and wherein the first part is moved to an end portion of the preceding pattern in the another plurality of patterns.

14. The system of claim 8, wherein the processor is further configured to:
select the length of the first part equals to the number of identified pipeline stages.

15. A non-transitory computer readable medium comprising stored instructions, which when executed by a processor, cause the processor to:
identify pipeline stages in a pipeline path of a design for test of an integrated circuit design;
split each pattern of a plurality of patterns into a first part and a second part, wherein a length of the first part is a function of a number of the identified pipeline stages; and
reformat the plurality of patterns to generate another plurality of patterns such that the first part and the second part of each pattern of the plurality patterns are included in different patterns of the another plurality of patterns.

16. The non-transitory computer readable medium of claim 15, wherein the processor is further configured to:
add at least one padding pattern at a start of the another plurality of patterns that includes null values, wherein the at least one dummy pattern provides load values for a first real pattern and wherein the at least one dummy pattern is loaded before other patterns in the another plurality of patterns.

17. The non-transitory computer readable medium of claim 16, wherein the processor is further configured to:
perform a first capture cycle after loading the first real pattern.

18. The non-transitory computer readable medium of claim 16, wherein the at least one dummy pattern comprises a quantity of dummy patterns based on a quantity of identified pipeline stages and a scan shift length of a core of the DFT.

19. The non-transitory computer readable medium of claim 15, wherein the processor is further configured to
move the first part associated with a pattern of the plurality of patterns to a preceding pattern in the plurality of patterns.

20. The non-transitory computer readable medium of claim 15, wherein the processor is further configured to:
select the length of the first part equals to the number of identified pipeline stages.

\* \* \* \* \*